United States Patent [19]
Noneman et al.

[11] Patent Number: 5,327,136
[45] Date of Patent: Jul. 5, 1994

[54] ASYNCHRONOUS SUCCESSIVE APPROXIMATION ANALOG-TO-DIGITAL CONVERTER

[75] Inventors: Mark E. Noneman, Ramona; Clark R. Westmont, Emeryville, both of Calif.

[73] Assignee: TRW Inc., Redondo Beach, Calif.

[21] Appl. No.: 932,434

[22] Filed: Aug. 19, 1992

[51] Int. Cl.$^5$ .............................................. H03M 1/36
[52] U.S. Cl. ...................................... 341/159; 341/155
[58] Field of Search ................ 341/155, 159, 163, 158

[56] References Cited

U.S. PATENT DOCUMENTS

| | | | |
|---|---|---|---|
| 4,763,106 | 8/1988 | Gulczynski | 341/159 |
| 4,926,180 | 5/1990 | Anastassiou | 341/159 |
| 4,965,579 | 10/1990 | Liu et al. | 341/159 |
| 4,987,417 | 1/1991 | Buckland | 341/159 |
| 5,117,235 | 5/1992 | Ho-sun | 341/159 |

Primary Examiner—Sharon D. Logan
Attorney, Agent, or Firm—Ronald L. Taylor

[57] ABSTRACT

An N-bit asynchronous successive approximation analog-to-digital converter is provided for converting an analog signal to a binary coded representation thereof. The analog-to-digital converter employs N inverting amplifiers. Each of the inverting amplifiers receives a scaled analog input signal and provides a one bit output of the binary coded output. The scaled analog input signal applied to each inverting amplifier includes an analog input signal and feedback signals from each of the inverting amplifiers which provide a more significant output bit of the binary coded output. Each inverting amplifier thereby provides an output dependent upon the amplifier's threshold voltage which output provides one bit of the binary coded representation. In addition, each inverting amplifier may further be adapted to receive a reference signal.

16 Claims, 3 Drawing Sheets

ASYNCHRONOUS SUCCESSIVE APPROXIMATION ANALOG-TO-DIGITAL CONVERTER

BACKGROUND OF THE INVENTION

1. Technical Field

This invention relates to analog-to-digital converters for converting an analog input signal to a digital output representation and, more particularly, to an asynchronous successive approximation analog-to-digital converter.

2. Discussion

Analog-to-digital converters are commonly used in a wide variety of applications for converting an analog signal to a digital representation thereof. One common method of providing analog-to-digital conversion is with successive approximation. Successive approximation generally employs a comparator, a digital-to-analog (D/A) converter and a successive approximation register (SAR) and additional electronic devices such as clocks, flip-flops and latches.

A conventional successive approximation analog-to-digital converter is essentially a synchronous device that requires at least N clock cycles to provide an N-bit conversion. As a result, a four-bit successive approximation conversion would generally require at least four clock cycles. In addition, the typical successive approximation converter is a relatively slow device because it does not make comparisons with the input signal simultaneously as is generally accomplished with a flash converter.

Another method of providing analog-to-digital conversion is with the use of a flash converter. A conventional analog-to-digital flash converter generally employs $2^N$ comparators in conjunction with an accurate resistor network. As such, the flash converter generally requires at least $2^N$ electrical components including the $2^N$ comparators to perform an N-bit conversion. As a result, the relatively large number of electrical components that are required may lead to a very high circuit complexity, especially for high bit converters.

It is therefore desirable to obtain an analog-to-digital converter that is asynchronous and therefore does not require any clock timing. In addition, it is further desirable to obtain such an analog-to-digital converter that requires fewer electrical components than the conventional flash converter.

SUMMARY OF THE INVENTION

In accordance with the teachings of the present invention, an asynchronous analog-to-digital converter is provided for converting an analog input signal to an N-bit binary output representation thereof. The converter includes N inverting amplifiers. Each inverting amplifier receives a scaled analog input signal and provides as an output one bit of the N-bit binary output representation. The scaled analog input signal includes the analog input signal and feedback output signals from each of the inverting amplifier outputs which provides a more significant bit of the N-bit binary output.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENT

Figure 1:
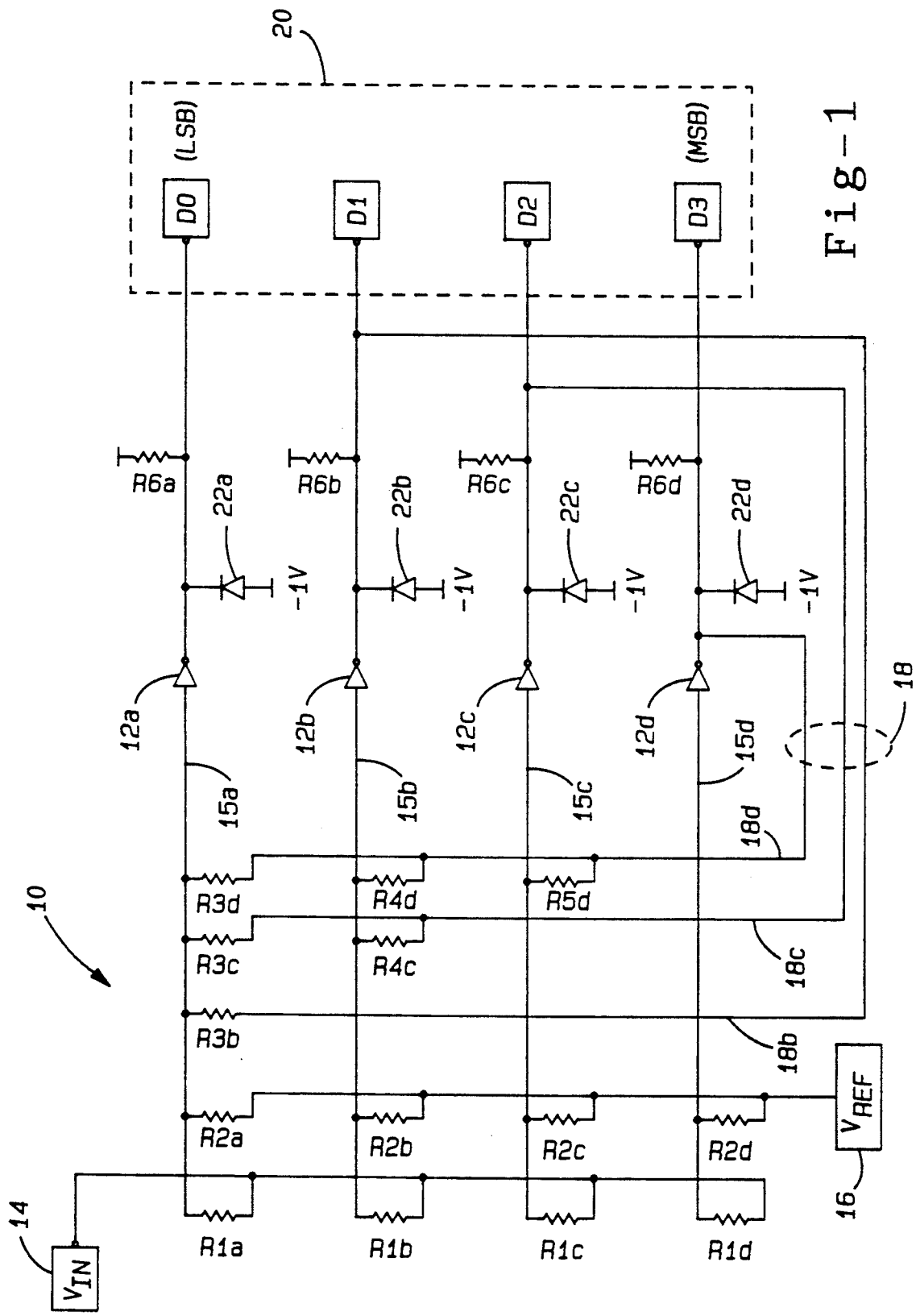
FIG. 1 is a circuit diagram which illustrates a four-bit asynchronous successive approximation analog-to-digital converter in accordance with the present invention.

Turning now to FIG. 1, a four-bit asynchronous successive approximation analog-to-digital converter 10 is shown therein in accordance with the present invention. In general, the analog-to-digital converter 10 receives a sampled analog input signal $V_{IN}$ and converts the analog signal $V_{IN}$ to a four-bit binary coded representation 20. Although a four-bit converter 10 is illustrated and described herein, the invention applies to any N-bit analog-to-digital converter.

The four-bit analog-to-digital converter 10 employs four inverting amplifiers 12a through 12d. For any N-bit converter, the invention requires N inverting amplifiers. Each of inverting amplifiers 12a through 12d receives an input signal and provides as an output, one of the bits D0 through D3 of the binary coded output 20. Each of the inverting amplifiers 12a through 12d provides a high output signal when the amplifier's threshold voltage is exceeded by the voltage of the input applied thereto. Otherwise, each of inverting amplifiers 12a through 12d provides a low output signal. The four-bit binary coded output 20 includes binary output bits D0 through D3 which are arranged in increasing order of significance. As such, binary output bit D0 is the least significant bit while the remaining binary output bits D1 through D3 follow with increasing significance. As a result, binary output bits (D0, D1, D2 and D3) have output representations of ($2^0$, $2^1$, $2^2$ and $2^3$), respectively.

The analog-to-digital converter 10 includes an input terminal 14 for receiving a sampled analog input signal $V_{IN}$. Each of the inverting amplifiers 12a through 12d are connected to the input terminal 14 via a first plurality of resistors R1a through R1d. The first plurality of resistors R1a through R1d provide resistance of equal value (relatively equal to 1). As such, the sampled analog input signal $V_{IN}$ is equally tapped from each of the first plurality of resistors R1a through R1d and applied as an input to the corresponding inverting amplifiers 12a through 12d. In doing so, the first inverting amplifier 12a receives the sampled analog input signal $V_{IN}$ tapped from resistor R1a. The second inverting amplifier 12b receives the sampled analog input signal $V_{IN}$ tapped from resistor R1b. The third inverting amplifier 12c receives the sampled analog input signal $V_{IN}$ tapped from resistor R1c. Finally, the fourth inverting amplifier 12d receives the sampled analog input signal $V_{IN}$ tapped from resistor R1d.

The analog-to-digital converter 10 further includes a second input terminal 16 for receiving a reference voltage signal $V_{REF}$. A second plurality of resistors R2a through R2d are connected between the second input terminal 16 and the input of each of the corresponding inverting amplifiers 12a through 12d. As such, the reference voltage signal $V_{REF}$ is tapped from each of the second plurality of resistors R2a through R2d and applied as an input to the corresponding inverting amplifiers 12a through 12d.

The resistor values for the second plurality of resistors R2a through R2d vary relative to one another according to the significance of the binary output provided by the corresponding inverting amplifiers 12a through 12d. For an N-bit binary output code, resistor R2a has a relative resistance value of $2^N$. The resistor R2b has a relative resistance value of $2^{N-1}$. In a similar fashion, resistor R2c has a relative resistance value of $2^{N-2}$. Finally, resistor R2d has a relative resistance value of $2^{N-3}$. For example, in the four-bit converter 10 shown, if resistor R2a has a resistance value of 160 Ohms, resistors R2b, R2c and R2d would have resistance values of 80, 40 and 20 Ohms, respectively. The relative resistance values essentially determine the relative magnitude of the reference signal applied to each of the corresponding inverting amplifiers 12a through 12d. In effect, the reference voltage signal $V_{REF}$ provides for scaling of the sampled analog input signal $V_{IN}$ to thereby allow for a wide range of possible inputs.

Each of the inverting amplifiers 12a through 12d further receives a feedback signal 18 from the output of each of the inverting amplifiers 12a through 12d which provide a more significant bit of the binary coded output 20. For example, the first inverting amplifier 12a which provides the least significant bit D0 of the binary output code 20 receives feedback signals 18b through 18d from the outputs of the remaining inverting amplifiers 12b through 12d. Similarly, the second inverting amplifier 12b which provides for the next significant bit D1 of the binary output code 20 receives feedback signals 18c and 18d from the output of the inverting amplifiers 12c and 12d. The third inverting amplifier 12c, likewise, receives a feedback signal 18d from the fourth inverting amplifier 12d. The fourth inverting amplifier 12d does not receive any feedback signal because it provides the highest significant bit D3 of the binary output code 20.

The feedback signals 18b through 18d are applied to the inputs of the inverting amplifiers 12a through 12c via resistors R3b through R3d, R4c, R4d and R5d. Resistors R3d, R4d an R5d each have a relative resistance value of $2^{N-3}$. As such, feedback signal 18d is adjusted in magnitude according to the resistance values and equally applied to the inputs of the inverting amplifier 12a through 12c. Similarly, resistors R3c and R4c have relative resistance values of $2^{N-2}$. The feedback signal 18c is thereby adjusted and equally applied to the inputs of inverting amplifiers 12a and 12b. Finally, resistor R3b has a relative resistance value of $2^{N-1}$. The feedback signal 18b is thereby adjusted and applied as an input to the first inverting amplifier 12a. In this way, the output voltage of the inverting amplifiers 12a through 12d and the feedback resistors R3b through R3d, R4c, R4d, and R5d form a digital-to-analog converter which subtracts, as appropriate, an analog voltage from the sampled analog input signal $V_{IN}$ to provide scaled analog input signals 15a through 15d to each of inverting amplifiers 12a through 12d.

Coupled to the output of each of the inverting amplifiers 12a through 12d are diodes 22a through 22d. Each of diodes 22a through 22d have outputs connected to the output of the corresponding inverting amplifiers 12a through 12d and a voltage signal of approximately negative one volt connected to the input. As a result, the diodes 22a through 22d are essentially connected in reverse direction to provide for a constant high or low output signal at the output of each inverting amplifier.

In addition, each of a plurality of resistors R6a through R6d are connected in parallel to the corresponding outputs of the inverting amplifiers 12a through 12d. Resistors R6a through R6d operate to pull up the inverting amplifier to an appropriate voltage when in the high state.

In operation, the analog-to-digital converter 10 receives a sampled analog input signal $V_{IN}$ at the input terminal 14. The sampled analog input signal $V_{IN}$ is tapped via the first plurality of resistors R1a through R1d and equally applied to the corresponding inverting amplifiers 12a through 12d. In addition, a reference voltage signal $R_{REF}$ is received at the second input terminal 16. The reference voltage signal $V_{REF}$ is applied in different magnitudes to the input of each of the inverting amplifiers 12a through 12d via the second plurality of resistors R2a through R2d. The inverting amplifiers 12a through 12d further receive feedback signals 18 from each of the inverting amplifier outputs which provide a more significant bit of the binary output code 20. The inverting amplifiers 12a through 12d thereby receive scaled analog input signals 15a through 15d, each of which is a combination of the analog input signal $V_{IN}$, a reference voltage signal $V_{REF}$ and feedback signals 18. In response, each of inverting amplifiers 12a through 12d provides an output which is dependent upon the inverting amplifier's threshold voltage. Each of the amplifier outputs are then provided as one bit of the binary coded output 20.

Figure 2:
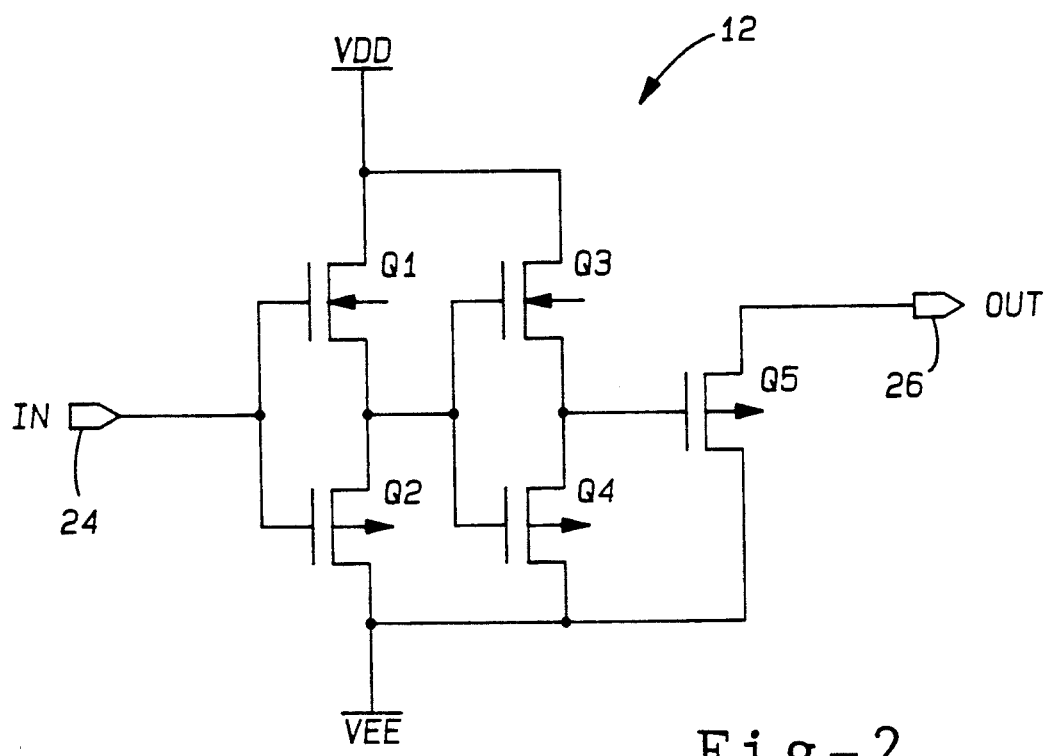
FIG. 2 is a circuit diagram which illustrates an example of an inverting amplifier which may be used with the present invention.

FIG. 2 illustrates one example of an inverting amplifier 12 that may be used in accordance with the present invention. The inverting amplifier shown as a CMOS inverting amplifier 12 with an open drain output. The inverting amplifier 12 receives an input at an input terminal 24. The input is applied to transistors Q1 through Q5 which provide an output to an output terminal 26. The inverting amplifier 12 shown is merely an example, as any of a number of amplifiers may be employed for purposes of this invention.

Figure 3:
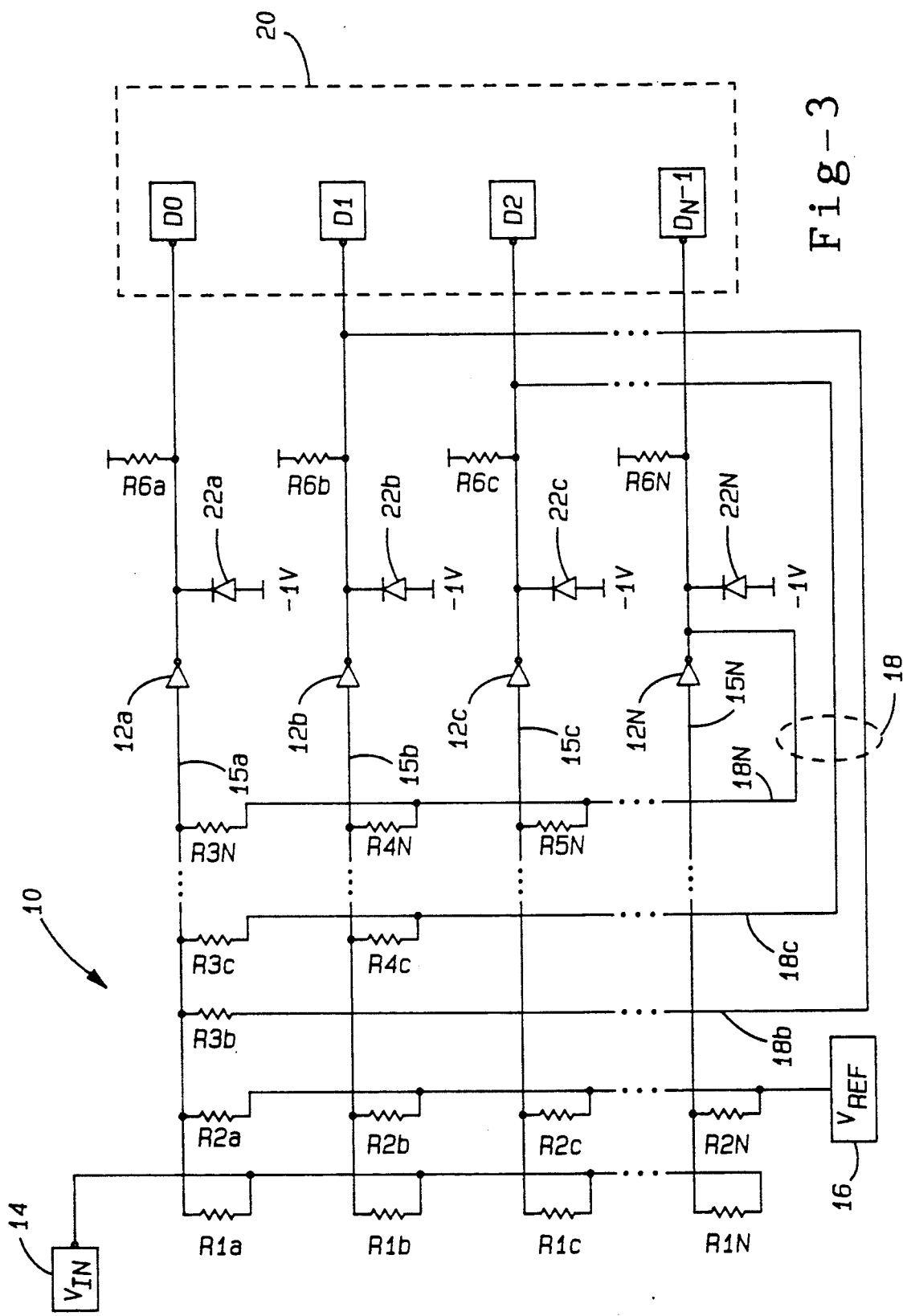
FIG. 3 is a circuit diagram which illustrates an N-bit asynchronous successive approximation analog-to-digital converter in accordance with the present invention.

The analog-to-digital converter 10 has been described in detail herein in connection with an example of a four-bit binary output code. However, the analog-to-digital converter 10 may provide for any N-bit binary output code as shown in FIG. 3. For any N-bit analog-to-digital converter 10, it is necessary to provide N number of inverting amplifiers 12a through 12N. Generally, the larger the bit size of the converter, the higher the precision. However, there may be practical limitations on the size of the converter, such as the absolute size of the resistor values, the accuracy of resistors having relative values ranging from 1 to $2^N$, the relative tracking of resistor values with respect to temperature, and the time required by the circuit to measure the input signal (approximately N times the propagation delay of a single inverting amplifier).

In view of the foregoing, it can appreciated that the present invention enables the user to achieve an asynchronous successive approximation analog-to-digital converter. Thus, while this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. An analog-to-digital converter comprising:

input means for receiving a sampled analog input signal;

output means for supplying a binary coded output signal having a plurality of bits of binary significance; and a plurality of inverting amplifiers connected to said input means, each of said amplifiers having an input for receiving a scaled analog input signal and an output for providing one bit of the binary coded output signal, wherein each of said scaled analog input signals includes a combination of said sampled analog input signal and a feedback output signal from each of the amplifier outputs which provides a more significant bit of the binary output signal, and each of said feedback output signals are tapped from the output of an associated amplifier and scaled in proportion to the binary significance associated with said associated amplifier.

2. The analog-to-digital converter as defined in claim 1 wherein:

said binary coded output signal includes N-bits; and said plurality of inverting amplifiers includes N-inverting amplifiers.

3. The analog-to-digital converter as defined in claim 1 wherein each of said feedback output signals are tapped from the output of said associated inverting amplifiers and scaled via a resistive network.

4. The analog-to-digital converter as defined in claim 3 wherein said feedback output signals are scaled with a first array of resistors, each of said resistors being connected between the input of one amplifier and the output of an amplifier which provides a higher significance output bit, said first array of resistors operating as a distributed digital-to-analog converter for scaling the sampled analog input signal to an appropriate bit range for each amplifier.

5. The analog-to-digital converter as defined in claim 4 wherein each of said amplifiers further receives a reference signal having a magnitude which depends on the significance of the output bit provided by the associated amplifier.

6. The analog-to-digital converter as defined in claim 5 further comprising a second array of N-resistors, each of said second array of resistors being connected to the input of one of said amplifiers for allowing the reference signal to be tapped from a single source.

7. The analog-to-digital converter as defined in claim 1 wherein each of said inverting amplifiers provides a high or low output which depends on whether the scaled analog input signal exceeds the threshold voltage thereof.

8. An analog-to-digital converter for converting an analog input signal to an N-bit binary coded output signal, said converter comprising:

input means for receiving an analog input signal;

output means for supplying an N-bit binary coded output; and a network including N amplifiers, each of said amplifiers providing an output for one bit of the binary coded output wherein each of said amplifiers receives an input which includes a combination of said analog input signal and a feedback output signal from each of the amplifier outputs which provides a more significant bit of the binary output signal;

and wherein each of said feedback output signals are tapped from the output of an associated amplifier and scaled in proportion to the significance of the binary bit provided by that associated amplifier.

9. The analog-to-digital converter as defined in claim 8 wherein said feedback output signals are scaled with a first array of resistors, each of said resistors being connected between the input of one amplifier and the output of an amplifier which provides a higher significance output bit, said first array of resistors operating as a distributed digital-to-analog converter for scaling the sampled analog input signal to an appropriate bit range for each amplifier.

10. The analog-to-digital converter as defined in claim 8 wherein each of said amplifiers further receives a reference signal having a magnitude proportional to the significance of the output bit provided by the associated amplifier.

11. The analog-to-digital converter as defined in claim 10 further comprising a second array of N-resistors, each of said second array of resistors being connected to the input of one of said amplifiers for allowing said reference signals to be tapped from a single source.

12. The analog-to-digital converter as defined in claim 8 wherein said amplifiers comprise inverting amplifiers.

13. The analog-to-digital converter as defined in claim 12 wherein each of said inverting amplifiers provides a high or low output which depends on whether the scaled analog input signal exceeds the threshold voltage thereof.

14. A method for converting an analog signal to an N-bit binary representation thereof, said method comprising:

receiving an analog input signal;

applying scaled analog input signals to inputs of N-inverting amplifiers, each of said inverting amplifiers providing one bit of said N-bit binary output; and subtracting feedback signals from said analog input signal to thereby provide for each of said scaled analog input signals, each of said feedback signals including the output from each of associated inverting amplifiers which provide for a more significant bit of the binary output, and which feedback signals are scaled in proportion to the binary significance provided by said associated inverting amplifier.

15. The method as defined in claim 14 wherein each of said inverting amplifiers provide a high or low output depending on whether said scaled analog input signal exceeds the threshold voltage thereof.

16. The method as defined in claim 15 further comprising the step of:

applying a reference voltage to the input of each of said inverting amplifiers to thereby allow for adjustment of the analog input range, said reference voltage being dependent upon the significance of the output provided by the associated inverting amplifiers.

* * * * *